US009130586B1

(12) United States Patent
Raz

(10) Patent No.: US 9,130,586 B1
(45) Date of Patent: Sep. 8, 2015

(54) SYSTEM AND METHOD OF DIGITAL-TO-ANALOG SIGNAL CONVERSION

(71) Applicant: Gil M. Raz, Concord, MA (US)

(72) Inventor: Gil M. Raz, Concord, MA (US)

(73) Assignee: SYSTEMS & TECHNOLOGY RESEARCH, LLC, Woburn, MA (US)

( * ) Notice: Subject to any disclaimer, the term of this patent is extended or adjusted under 35 U.S.C. 154(b) by 0 days.

(21) Appl. No.: 14/541,584

(22) Filed: Nov. 14, 2014

Related U.S. Application Data

(60) Provisional application No. 61/904,102, filed on Nov. 14, 2013.

(51) Int. Cl.
*H03M 1/06* (2006.01)
*H03M 1/66* (2006.01)
*H03M 1/74* (2006.01)

(52) U.S. Cl.
CPC ............... *H03M 1/661* (2013.01); *H03M 1/74* (2013.01)

(58) Field of Classification Search
CPC ..... H03M 1/661; H03M 1/74; H03M 1/1009; H03M 1/46; H03M 3/50; H03M 1/66
USPC .......................... 341/117–120, 144
See application file for complete search history.

(56) References Cited

U.S. PATENT DOCUMENTS

| 6,278,391 | B1 * | 8/2001 | Walker | 341/118 |
| 6,646,581 | B1 * | 11/2003 | Huang | 341/143 |
| 7,262,725 | B2 * | 8/2007 | Huang et al. | 341/141 |

* cited by examiner

*Primary Examiner* — Jean B Jeanglaude
(74) *Attorney, Agent, or Firm* — Kriegsman & Kriegsman

(57) ABSTRACT

A system for reconstructing broadband analog signals from digital information includes a digital processing unit for decomposing a digital input signal into a plurality of multirate, digital input signal sub-components with optimized quantization levels, and a digital-to-analog converter (DAC) bank for converting the plurality of digital input signal sub-components into a corresponding set of analog signal sub-components, which are then combined and time-aligned. The digital processing unit preferably includes a multirate filterbank for separating the digital input signal through discrete wavelet decomposition, such through Haar wavelet decomposition. The DAC bank includes an array of digital-to-analog converters (DACs) with sample rates that vary by a constant factor. By combining the broadband capabilities of one or more relatively fast DACs with the accuracy associated with one or more relatively slow DACs, the digital-to-analog conversion system is able to achieve high bandwidth capabilities at an acceptable level of dynamic range.

17 Claims, 7 Drawing Sheets

SYSTEM AND METHOD OF DIGITAL-TO-ANALOG SIGNAL CONVERSION

STATEMENT REGARDING FEDERALLY SPONSORED RESEARCH OR DEVELOPMENT

This invention was made with government support under Contract No. N68936-13-C-0108 awarded by the United States Navy. The government has certain rights in the invention.

FIELD OF THE INVENTION

The present invention relates generally to the field of signal processing and more particularly to techniques for reconstructing analog signals from digital information.

BACKGROUND OF THE INVENTION

A digital-to-analog converter (DAC) is an electronic device that is utilized to covert digital data into analog form. As such, digital-to-analog converters are commonly used in a wide variety of environments in order to generate continuous, physical signals, such as signals relating to voltage, current or charge, using digital information.

Digital-to-analog converters typically perform signal conversion by representing an input digital signal into a sequence of nearly constant, analog signals of a fixed duration that is defined by the sample rate of a clock signal. The aforementioned sequence, or step function, of analog signals is then processed using analog filtering techniques to yield a smoothly varying signal.

Presently, there are many different types of DACs available in the marketplace. DACs are commonly categorized, or defined, by several characteristic performance metrics including, inter alia, dynamic range (i.e. signal fidelity or quality), bandwidth (i.e. the range of measurable frequencies), and power consumption.

As can be appreciated, the dynamic range associated with a DAC is influenced by a number of contributing factors including, but not limited to, the number of signal bits as well as the overall fidelity of signals relative to noise, distortion and interference. The dynamic range (DR), or dynamic performance, of a DAC is often quantified in terms of its effective number of bits (ENOB), which represents the number of bits for each measure that are, on average, not noise.

The bandwidth associated with a DAC is also influenced by a number of contributing factors including, among other things, the sample rate of the input signal that the device can handle. In particular, the bandwidth associated with a DAC is generally limited to one-half the input sample rate in view of the Nyquist sampling theorem, which states at least two samples per cycle are required to ensure proper signal reconstruction (i.e. the sampling rate must be at least two times the bandwidth of the signal).

It has been found that conventional DACs suffer from a notable drawback. Specifically, when DACs are utilized in connection with signals of relatively broad bandwidth (i.e. signals of faster speeds), a correspondingly high sample rate is required in view of the Nyquist sampling theorem. For example, a 10 GHz instantaneous bandwidth output signal would require an input sample rate of at least 20 Gsamples/sec.

Accordingly, when required to handle signals of a higher frequency, or broader bandwidth, the corresponding increase in the sampling rate causes a digital-to-analog converter to operate in a less accurate manner due to natural imperfections in the physical device. The inaccuracies associated with the operation of conventional DACs when handling faster, high frequency signals often yield a dynamic range that is unacceptably low and, as a result, problematic.

FIG. 1 is a graph depicting the effective dynamic range of a selection of conventional DACs in view of intended signal bandwidth. It is to be understood that the selection of conventional DACs shown in FIG. 1, although not entirely inclusive, nonetheless provides a reflective landscape of DACs presently available in the marketplace.

As can be readily seen in FIG. 1, most conventional DACs exhibit a higher dynamic range in connection with lower bandwidth signals. However, when conventional DACs are designed to handle higher bandwidth signals, the performance characteristics associated with the DACs tend to drop, as evidenced by the corresponding decrease in dynamic range.

In view thereof, various techniques have been applied in the art to enable digital-to-analog converters to produce high bandwidth output signals at an acceptable dynamic range level.

One technique utilized to enable DACs to produce high bandwidth output signals at acceptable dynamic range levels is to simply manufacture a higher quality DAC through the use of, among other things, improved fabrication processes, higher performing materials, and more complex circuitry that includes embedded error correction. However, it has been found that the above-identified techniques substantially increase the overall manufacturing costs associated with the DAC, which is highly undesirable.

Another technique utilized to enable DACs to produce high bandwidth output signals at acceptable dynamic range levels is to combine together multiple DACs that share a common, lower sample rate. For instance, the aforementioned technique is often implemented through the use of (i) multiple, lower rate DACs with time staggered samples, (ii) multiple DACs, with each DAC designated to cover a particular bandwidth of operation, or (iii) multiple DACs followed by upconversion to different bandwidths. However, it has been found that the above-identified techniques tend to experience significant limitations relating to output bandwidth, dynamic range, size requirements, and/or power consumption (e.g. due to errors inherent in designing and manufacturing parallel circuits, such as output signal mismatch effects). Moreover, these configurations, which aggregate multiple, lower sample rate DACs, incur a penalty of errors due to an imperfect alignment, or interleaving, of the output signals from the various DACs (e.g. with respect to time, bandwidth, amplitude, phase, etc.). In particular, it has been found that signal alignment errors are most prevalent when a large number of DACs are aggregated.

SUMMARY OF THE INVENTION

It is an object of the present invention to provide a new and improved system and method for converting a digital input signal into a corresponding analog output signal.

It is another object of the present invention to provide a system and method as described above that is able to produce high bandwidth output signals at an acceptable dynamic range level.

It is yet another object of the present invention to provide a system and method as described above that has a limited number of parts, is limited in size and weight, is inexpensive to manufacture, and requires limited power consumption.

Accordingly, as one feature of the present invention, there is provided A system for converting a digital input signal into a corresponding analog output signal, the system comprising (a) a digital processing unit for decomposing the digital input signal into a plurality of digital input signal sub-components, and (b) a multirate digital-to-analog converter (DAC) bank, the DAC bank comprising an array of digital-to-analog converters (DACs) with varying sample rates for converting the plurality of digital input signal sub-components into a corresponding set of analog signal sub-components, the DAC bank combining together the set of analog signal sub-components to yield the analog output signal.

Various other features and advantages will appear from the description to follow. In the description, reference is made to the accompanying drawings which form a part thereof, and in which is shown by way of illustration, an embodiment for practicing the invention. The embodiment will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings wherein like reference numerals represent like parts.

DETAILED DESCRIPTION OF THE INVENTION

Digital-to-Analog Signal Conversion System 11

Figure 1:
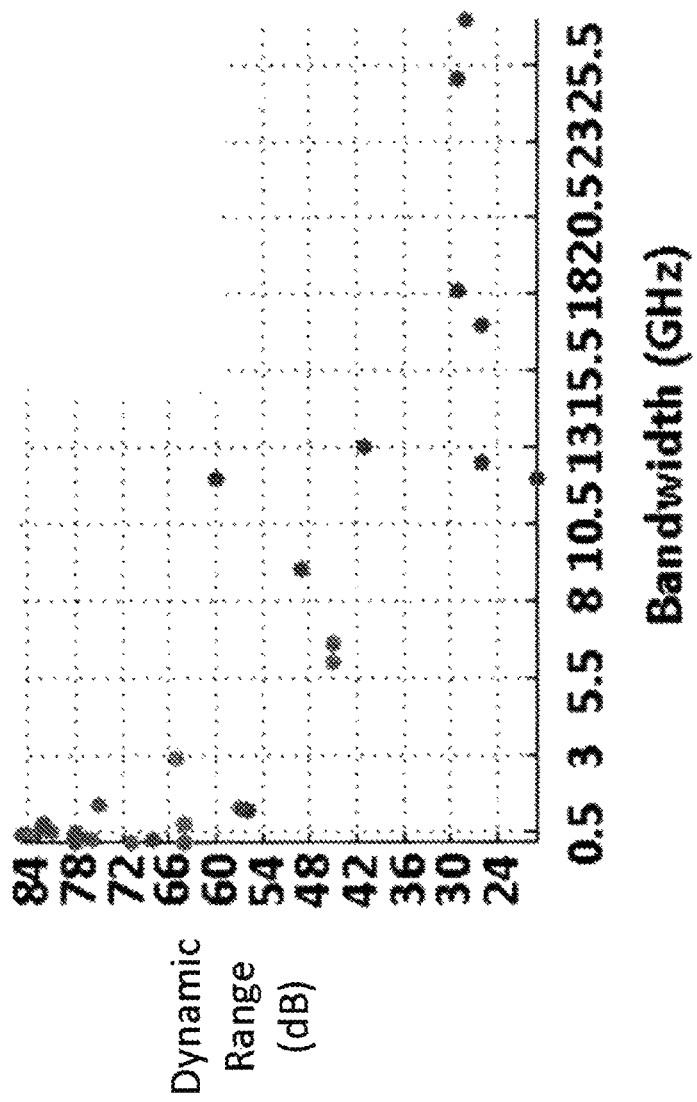
FIG. 1 is a graphical representation of a selection of conventional digital-to-analog (DAC) converters, the graphical representation depicting the dynamic range for each DAC converter in relation to its designated signal bandwidth.
Figure 2:
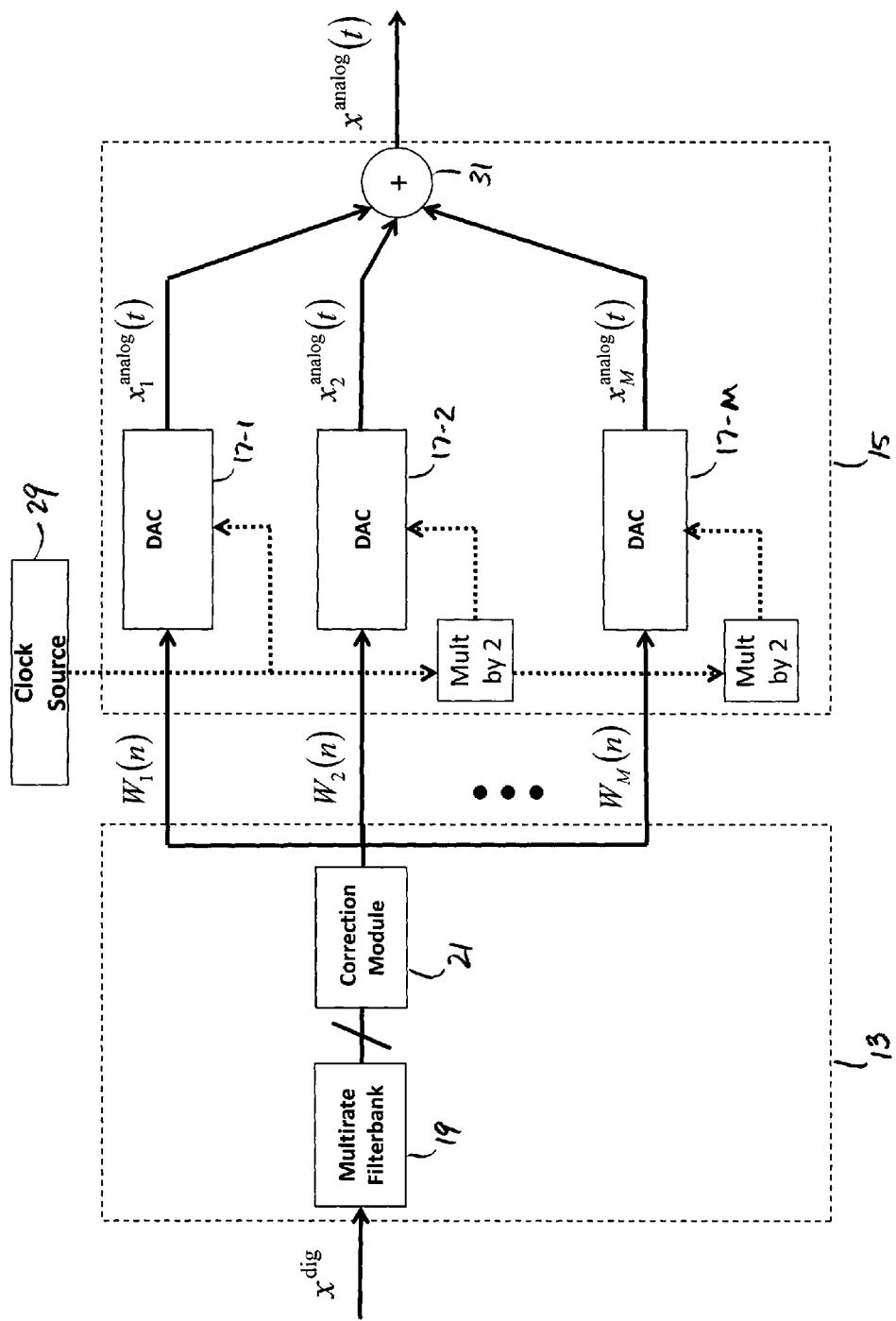
FIG. 2 is a simplified schematic representation of a novel system for converting a digital input signal into a corresponding analog output signal, the system being constructed according to the teachings of the present invention.

Referring now to FIG. 2, there is shown a system for converting a digital input signal into a corresponding analog output signal, the system being constructed according to the teachings of the present invention and identified generally by reference numeral 11. As will be explained further in detail below, system 11 is specifically designed to produce broadband signals at a high dynamic range and without a substantial increase in size, weight and/or power consumption requirements, which is a principal object of the present invention.

System 11 is constructed as an integrated device that comprises a digital processing unit 13 for, inter alia, decomposing a digital input signal $x^{dig}$ into a plurality of signal sub-components $W_1(n)$ thru $W_M(n)$ and a multirate (i.e. multiple sampling rate) DAC bank 15 for converting the plurality of signal sub-components $W_1(n)$ thru $W_M(n)$ into corresponding analog signals $x_1^{analog}(t)$ thru $x_M^{analog}(t)$ that are, in turn, combined together to yield an analog output signal $x^{analog}(t)$. As will be described further in detail below, system 11 is able to produce a relatively large bandwidth analog output signal $x^{analog}(t)$ at a high dynamic range by constructing DAC bank 15 using an array of individual DACs 17-1, 17-2 thru 17-m with varying sample rates and dynamic ranges.

Digital processing unit 13 prepares digital input signal $x^{dig}$ by, among other things, determining the various digital signal components $W_1(n)$ thru $W_M(n)$ that are input into each DAC 17 in DAC bank 15. More specifically, digital processing unit 13 calculates the amplitude of the signal stream that is input into each DAC 17 in DAC bank 15. By optimizing the quantization of the signal stream input into each DAC 17 in DAC bank 15, the slower, more accurate DACs 17 can be used to compensate for the natural limitations associated with the faster, less accurate DACs 17, which is a principal novel feature of the present invention.

Digital processing unit 13 preferably comprises a multirate filterbank 19 for decomposing, or separating, the time-based digital input signal $x^{dig}$ into the plurality of digital sub-components, or signal stream, $W_1(n)$ thru $W_M(n)$, with quantization of the sub-components being based on the SNOB of each DAC 17, and an error and mismatch correction module 21 for applying appropriate digital signal processing techniques to at least partially compensate for expected imperfections in the analog output signal $x^{analog}(t)$ when reconstructed.

As can be seen, each of the plurality of discrete digital signal streams $W(n)$ produced by filterbank 19 is designated for analog conversion by a corresponding digital-to-analog converter 17 in DAC bank 15. As a feature of the invention, the use of wavelet decomposition by digital processing unit 13 enables an efficient digital input signal $x^{dig}$ to be represented as a plurality of distinct, scalable components.

As defined herein, a wavelet decomposition is a mathematical function used to separate a given signal into a plurality of sub-components based on time (or space) and scale (or frequency). For instance, referring now to FIGS. 3(a)-(e), there is shown a series of signal graphs which are useful in understanding aspects of wavelet decomposition.

Figure 3A:
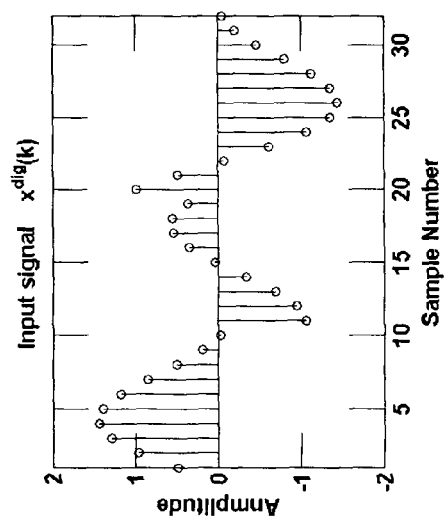
FIGS. 3(a)-(e) are a series of graphical representations that depict a digital input signal decomposed into a plurality of wavelet functions.
Figure 3B:
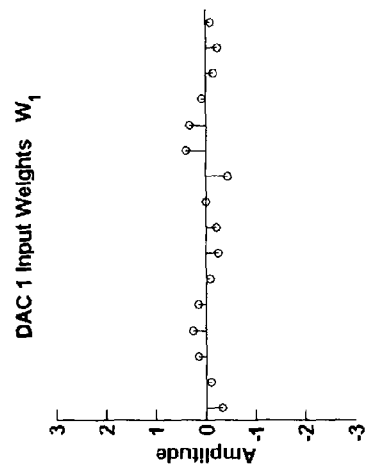
Figure 3C:
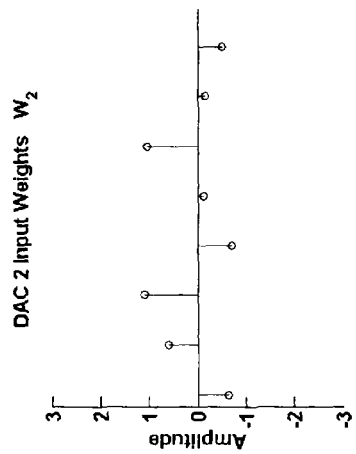
Figure 3E:
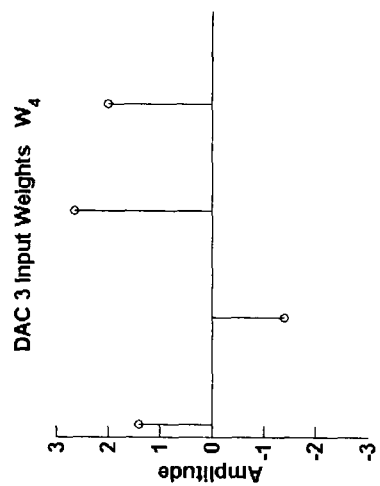
Figure 3D:
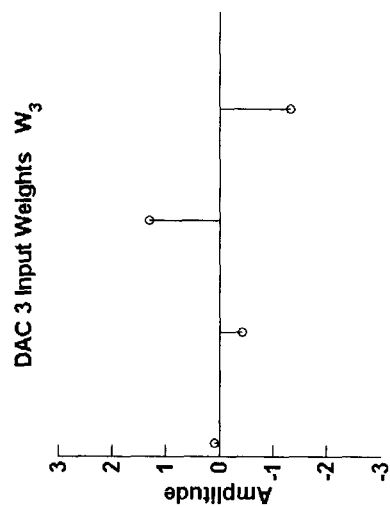

In FIG. 3(a), an oscillating, sample digital input signal $x^{dig}(k)$ is represented. Through the use of wavelet decomposition, sample digital input signal $x^{dig}(k)$ can be transformed, or separated, into the plurality of distinct, scalable components shown in FIGS. 3(b)-(e). As can be seen, in FIG. 3(b), the digital input signal $x^{dig}(k)$ is represented using a high, or fast, sampling rate but at a low amplitude scaling factor and commensurately fewer quantization levels to accommodate for the inherent inaccuracies (i.e. low dynamic range) associated with using such a high sampling rate. By contrast, in FIG. 3(e), the digital input signal $x^{dig}(k)$ is represented using a low, or slow, sampling rate but at a high amplitude scaling factor and more quantization levels to exploit the higher accuracy (i.e. high dynamic range) associated with using a low sampling rate.

Mathematically, a family of wavelets can be constructed from a function $\psi(t)$, which is sometimes referred to in the art as a "mother wavelet." A plurality of "daughter wavelets" $\psi_{a,b}(t)$ can then be formed by translation b and contraction a of the mother wavelet $\psi(t)$. Accordingly, an individual, or daughter, wavelet can be defined by the following equation:

$$\psi_{a,b}(t) = \frac{1}{\sqrt{a}} \psi\left(\frac{t-b}{a}\right)$$

The wavelet coefficient for a function, or signal, x(t) for a given translation, contraction pair (a,b) is therefore the inner product of signal x(t) with the individual, or daughter, wavelet $\psi_{a,b}(t)$. Conversely, the deconstructed signal can be reconstructed from its decomposed state by summing over the product of each daughter wavelet and its commensurate wavelet coefficient.

Since DAC bank 15 is inherently discrete (i.e. includes a finite number of DACs), the discrete wavelet transform (DWT) is of particular significance. Additionally, dyadic wavelets (i.e. wavelets with a=2, b=1) are of specific interest. Hence, for discrete variables (a, b), the wavelet decomposition samples can be represented in the following form:

$$WT_\psi\{x\}(a,b) = \langle x, \psi_{a,b} \rangle = \int_\mathcal{R} x(t)\psi_{a,b}(t)dt$$

The integration over time can be replaced by summation for time-sampled values. The reconstructed analog output signal x(t) can thus be represented in the following form:

$$x(t) = \sum_{m \in Z} \sum_{n \in Z} \langle x, \psi_{m,n} \rangle \psi_{m,n}(t)$$

Preferably, decomposition is achieved by multirate filterbank 19 through Haar wavelet decomposition. As defined herein, a Haar wavelet is sequence of "square-shaped" functions, which together form a wavelet family. For reasons to become apparent below, the use of Haar wavelets is desirable in this application due to its simple and low complexity nature as well as its constant amplitude for given time intervals, which is particularly well suited for the decomposition of signals with sudden transitions (e.g. analog signals output from conventional DACs, which have sharp transitions in amplitude for each clock cycle).

Figure 4:
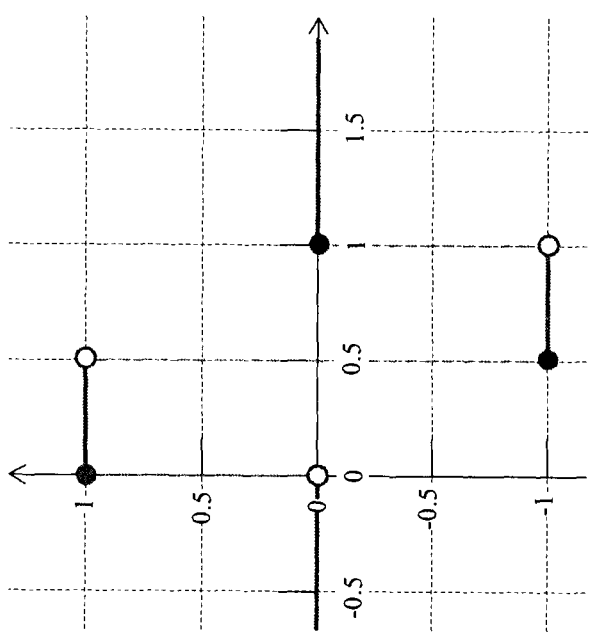
FIG. 4 is a graphical representation of a Haar wavelet function.

A Haar mother wavelet function generally has the form represented in FIG. 4, with a value of 1.0 from 0.0 to 0.5 in time, a value of −1 from 0.5 to 1.0 in time, and a value of 0.0 at all other points in time. As can be appreciated, the implementation of a Haar wavelet filterbank is particularly simple and useful in that the aforementioned mathematics involves only the adding, or subtracting, of a fixed number of sampled signal values in the order of their arrival.

Through the use of various dilates (i.e. signal widening or narrowing) and translates (i.e. signal shifting), any signal quantized in the digital domain can be easily and accurately represented through Haar wavelet decomposition. Furthermore, Haar decomposition coefficients have a constant, single value that is commensurate with the given clock rate of the decomposition which, in turn, allows for greater ease in interleaving the decomposed signal after analog conversion. For these reasons, Haar wavelet decomposition is particularly well suited for use in this application.

Figure 5:
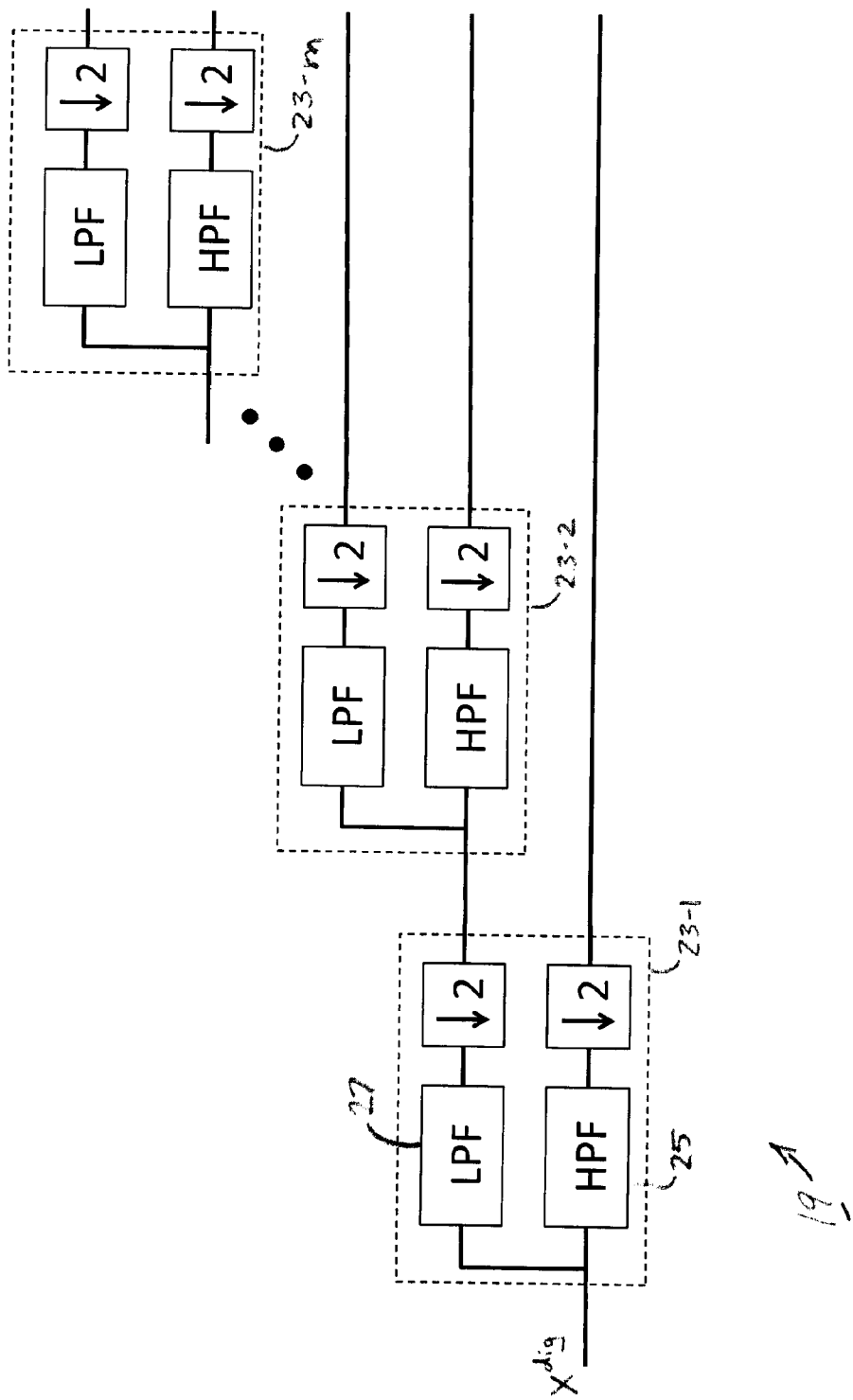
FIG. 5 is a detailed schematic implementation of the wavelet filterbank shown in detail in FIG. 2.

A wavelet decomposition is achieved, for instance, through the implementation of a conventional wavelet filterbank 19 of the type shown in detail in FIG. 5. It should be noted that wavelet filterbank 19 is not limited to the construction shown in detail in FIG. 5, but rather, could rely upon alternative wavelet filterbank constructions without departing from the spirit of the present invention.

As can be seen in FIG. 5, wavelet filterbank 19 separates a digital input signal $x^{dig}$ into multiple components through the use of a dyadic discrete filterbank construction that includes an array of filter pairs 23-1, 23-2 through 23-$m$. Each filter pair 23 preferably comprises a highpass filter 25 and a lowpass filter 27, each of which is followed by a factor of 2 downsampling. In turn, the output of each lowpass filter 27 serves as the input for the next sequential filter pair 23 in order to achieve the desired multirate signal decomposition W(n).

Referring back to FIG. 2, filterbank 19 engages in the process of decomposition, or analysis, on the digital input signal $x^{dig}$ which, in turn, yields a plurality of subband signals $W_1(n)$ thru $W_M(n)$, with each filter responsible for the generation of a corresponding subband signal. As will be explained further below, the output sample rates of filterbank 19 directly correspond to the clock rates of the various DACs 17 in DAC bank 15.

It should be noted that the utilization of a dyadic filterbank construction is desirable in that such an implementation provides both (i) low computational complexity and (ii) low latency, or time delay, between the arrival of the last input sample required to calculate the Haar coefficients and the calculation result (e.g. a single add-multiple operation suffices).

Although useful for the reasons set forth above, it is to be understood that digital processing unit 13 is not limited to the use of Haar wavelets for decomposition. Rather, it is to be understood that digital processing unit 13 could rely on alternative forms of mulitrate decompositions, including different mother wavelet choices as well as non-dyadic wavelets, without departing from the spirit of the present invention. Moreover, any decomposition of a digital signal into multirate streams with optimized quantization levels, such that fewer quantization levels are used at the higher sample rates and more quantization levels are used at the lower sample rates, is considered in this approach.

As an example, it should be noted that wavelet packet or shift invariant decompositions could be implemented in system 11 without departing from the spirit of the present invention. In fact, if additional information about the signal of interest is available or can be readily calculated (e.g. a particular band or time duration of interest), digital processing unit 13 could be constructed to include any type of multirate filterbank that is optimized to achieve a higher overall dynamic range.

As another example, it should be noted that a Haar wavelet implementation is appropriate for use with DACs but, at the same time, cannot be reduced to practice without error due to system imperfections (i.e. real DAC devices do not have ideal performance characteristics, such as instantaneous switching). Accordingly, it is to be understood that decomposition may be more accurately achieved using a slightly modified, or adjusted, Haar wavelet in place thereof.

Figure 6:
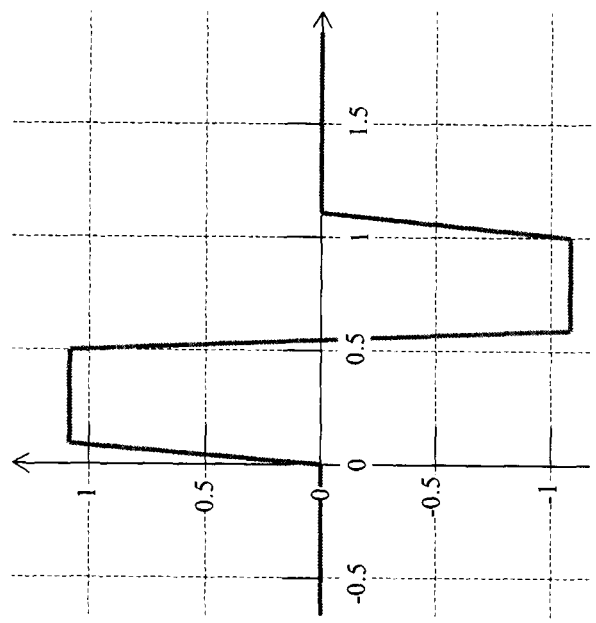
FIG. 6 is a graphical representation of a modification to the Haar wavelet function shown in FIG. 4.

Specifically, referring now to FIG. 6, there is shown an example of a Haar wavelet that has been slightly adjusted, or modified, to accommodate for natural imperfections associated with DAC devices. As can be seen, the modified Haar wavelet transitions in amplitude in a non-instantaneous fashion to achieve more realistic signal transition regions which are commensurate with the performance of actual DACs.

As referenced briefly above, error and mismatch correction module 21 is provided in digital processing unit 13 to accommodate for natural, expected errors introduced into the analog output signal $x^{analog}(t)$ by DAC bank 15 since each DAC 17 is a real component and, as such, is inherently imperfect. Accordingly, module 21 preferably includes signal processing techniques for correcting analog discrepancies due to circuit imperfections including, inter alia, time/phase mismatch, complex amplitude mismatch, direct current (DC) offset mismatch, nonlinear distortions, and sample rate transition errors.

In the present embodiment, module 21 is shown in system 11 between filterbank 19 and DAC bank 15. However, it is to be understood that error and mismatch correction module 21 could be located at an alternative location along the signal path without departing from the spirit of the present invention. For instance, it is envisioned that system 11 could be alternatively constructed with module 21 (i) preceding multirate filterbank 19, (ii) integrated directly into filterbank 19 (as opposed to being a separate functional module), or (iii) eliminated entirely without departing from the spirit of the present invention.

Referring back to FIG. 2, DAC bank 15 is constructed as an array of individual DACs 17 with varying sample rates and dynamic ranges. Preferably, the sample rate provided for each DAC 17 in DAC bank 15 is supplied from a common clock source 29, with the clock signal provided by source 29 being treated so as to vary the sample rate applied to each DAC 17, preferably by a common factor, as will be described further below. This sample rate variance between DACs 17 results in a corresponding variance in the dynamic range between DACs 17, which is particularly useful for reasons to become apparent below.

The use of varying sample rates for the inputs into array of DACs 17 is efficiently implemented through a multirate decomposition such as the Haar wavelet decomposition of digital input signal $x^{dig}$ by filterbank 19. As referenced previously, the output sample rates for filterbank 19 directly correspond to the clock rates for the array of DACs 17. Specifically, the output signal $W_1(n)$ from the first filterbank element corresponds to first DAC 17-1 and yields the lowest sample rate. The output signal $W_2(n)$ from the second filterbank element, which is designated for second DAC 17-2, yields a sample rate that is faster than the sample rate produced by the first filterbank element. This results in second DAC 17-2 producing an output analog signal at a slightly lower dynamic range than first DAC 17-1. The aforementioned construction continues based on the number of filterbank elements, with the last filterbank element yielding a sample rate designated for the last DAC 17-m that is commensurate with the desired overall bandwidth of output analog signal $x^{analog}(t)$.

The outputs of the array of DACs 17-1 thru 17-M are summed and aligned in time through a summation module 31 as part of a signal reconstruction, or synthesis process, with the product of the reconstruction process being analog output signal $x^{analog}(t)$. Preferably, one or more DACs 17 in DAC bank 15 utilize a relatively low sample rate in order to convert digital signals with a high level of accuracy. At the same time, one or more DACs 17 in DAC bank 15 may utilize a higher sample rate in order to convert digital signals in the broader bandwidth range. In this manner, by optimizing the quantization level for the digital signal input into each DAC 17 based on its dynamic range, the outputs from the plurality of DACs 17 can be combined together to yield a broader bandwidth (i.e., faster) analog signal with an acceptable level of accuracy (i.e. at a higher dynamic range), which is a principal object of the present invention.

It should be noted that the particular type of DAC 17 utilized in DAC bank 15 can be selected based on the particular application and characteristics required. For instance, less accurate DACs could be selected in order to minimize power requirements and thereby render system 11 more power efficient. At the same time, a more accurate DAC could be utilized for a limited number of the faster DACs 17 in DAC bank 15 in order to improve the overall dynamic range associated with system 11 without considerably increasing power requirements or manufacturing costs.

Preferably, DACs 17 in DAC bank 15 utilize sampling rates which vary by a common multiple for ease and simplification of design. For instance, in the present example, DACs 17 in DAC bank 15 preferably utilize sample rates which vary by a factor of 2 between successive DACs 17 (i.e. relative to their nearest neighbor DAC) in the array.

However, it should be noted that sampling rate differential between successive DACs 17 need not vary by a factor of 2. Rather, it is to be understood that the sampling rate differential between successive DACs could vary by an alternative factor (e.g. by a factor of 4 or another relatively low integer or by a non-integer factor) without departing from the spirit of the present invention.

In the present embodiment, first DAC 17-1 has the lowest sample rate (i.e. is the slowest operating DAC), the sample rate being defined by the signal provided by clock source 29. Because DAC 17-1 is the slowest operating DAC, first DAC 17-1 is the most accurate component in DAC bank 15 and, as a result, handles signals at the highest dynamic range.

By comparison, second DAC 17-2 utilizes a sample rate that is two times the sample rate used with first DAC 17-1. In the present invention, the sample rate for DAC 17-2 is achieved by multiplying the clock signal by a factor of 2. Due to the increase in its designated sample rate, second DAC 17-2 operates at a lower dynamic range than first DAC 17-1 (i.e. in a less accurate fashion) but, at the same time, is able to broaden, or widen, its signal bandwidth capabilities.

In the present example, an unspecified number (M) of DACs are shown in DAC bank 15, with the sample rate of each successive DAC being calculated by multiplying the clock by $2^{(M-1)}$. As can be appreciated, the last DAC 17-M is the fastest operating component and, as such, utilizes a coefficient reflective of the thinnest, or narrowest, Haar wavelet.

It is to be understood that dividers could be utilized in place of multipliers to vary the clock rate applied to DACs 17 in the present invention. In this manner, the fastest clock rate would be applied to DAC bank 15 first, with each successively slower clock rate being input into DAC bank 15 thereafter in a sequential fashion.

In the present embodiment, an undefined number of DACs 17 are shown in DAC bank 15. However, it is envisioned that a multirate DAC bank 15 with two, three or four separate DACs 17 would be sufficient in achieving the desired performance results for most applications. Yet, it is to be understood that the number of DACs 17 utilized in the construction of DAC bank 15 could be varied, as needed, to suit the particular needs within the intended environment.

As referenced above, the output of DACs 17 are summed together and time-aligned to yield reconstructed analog output signal $x^{analog}(t)$. Interleaving is preferably achieved through multirate decomposition such as the Haar decomposition of the input signal prior to analog conversion.

As described in detail above, system 11 is designed to decompose a digital input signal into a plurality of digital decompositions such as the Haar wavelet decomposition levels that are, in turn, treated by an array of DACs with varying sample rates. As a result, system 11 is inherently provided with a number of notable advantages.

As a first advantage, the utilization of wavelets or similar multirate time-frequency decompositions creates overcompleteness in the signal representation and thereby provides an extra degree of signal processing freedom in constructing DAC bank 15 and establishing its parameters (e.g., the number of DACs as well as the variance between sampling rates) without compromising accuracy in ultimately representing the digital input signal in analog form. This freedom compensates for some of the accuracy differentials between DACs and also allows for integration with additional types of signal treatment techniques. An important advantage of this overcomplete representation is the flexibility to allocate different quantization levels for each digital stream W(n) such that the overall dynamic range of the combined analog output signal $x^{analog}(t)$ has improved dynamic range.

As a second advantage, the utilization of an array of DACs with varying sample rates enables a relatively fast DAC (e.g. DAC 17-m) to operate with an otherwise undesirably low dynamic range since the overall dynamic range for DAC bank 15 is pulled higher by the slower DACs (e.g. DAC 17-1). In other words, the slower DACs compensate for the relatively low dynamic range of the faster DACs. At the same time, the faster DACs compensate for the limited bandwidth capabilities of slower DACs.

In this capacity, the structure of DAC bank 15 provides high bandwidth capabilities at an acceptable dynamic range without relying upon either complex fabrication processes, expensive materials, or complicated designs, which is a principal object of the present invention. In particular, due to the architecture set forth above, system 11 is able to handle both (i) wide bandwidth signals at a reasonable dynamic range and (ii) narrow bandwidth signals at a high dynamic range. By contrast, traditional systems are typically designed to be able to handle only one of the aforementioned signal types. For instance, a conventional system designed to handle wide bandwidth signals typically incurs an increase in error levels (i.e. a considerable reduction in dynamic range) when handling lower output frequencies.

Measured Test Results Using System 11

As referenced briefly above, system 11 could be implemented in a wide range of potential applications. To illustrate the advantages associated with digital-to-analog conversion system 11 over conventional digital-to-analog systems, actual test results are provided herein for both systems using a software-based simulation platform.

Figure 7A:
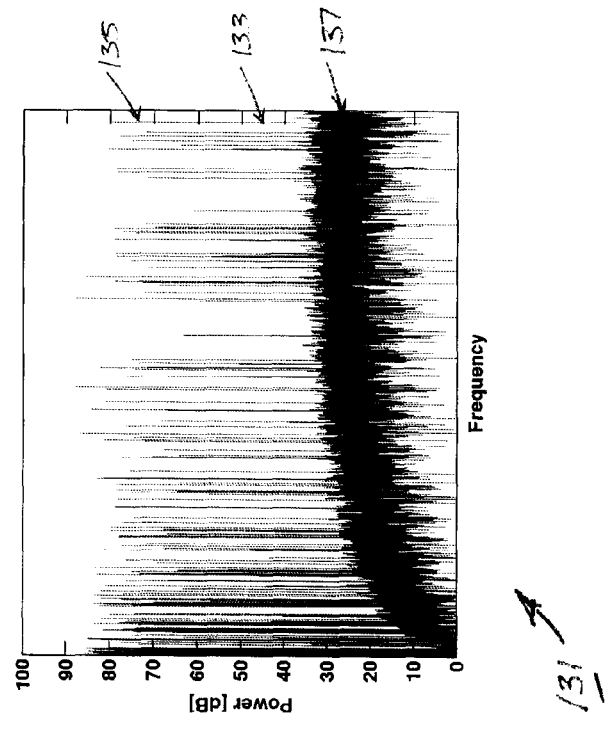
FIG. 7(a) is a graphical representation of a computer-simulated, analog output signal produced by a commercial off the shelf, digital-to-analog converter (DAC) in response to a digital input signal with certain characteristics.

Specifically, referring now to FIG. 7(a), there is shown a graphical representation of a computer-simulated, analog output signal produced by a commercial off the shelf (COTS) digital-to-analog converter (DAC) in response to a digital input signal with certain characteristics (e.g. multiple, strong signals throughout a wide bandwidth of operation, with the signals being denser in the lower frequency region), the graphical representation depicting signal strength, or power, in view of signal frequency and being identified generally by reference numeral 111. In the present simulation, a COTS DAC is utilized that has an effective number of bits (ENOB) value of 6.

As can be seen, the output signal 113 includes a desired component 115 that is approximately 80 dB in signal strength throughout the wide bandwidth of operation. However, the output signal 113 also includes a significant, noise component 117 of approximately 40 dB throughout the frequency range.

As a result, the conventional DAC exhibits a relatively low dynamic range of approximately 40 dB (i.e. the strength of the noise component 117 subtracted from the desired component 115) throughout the entire bandwidth of operation.

Figure 7B:
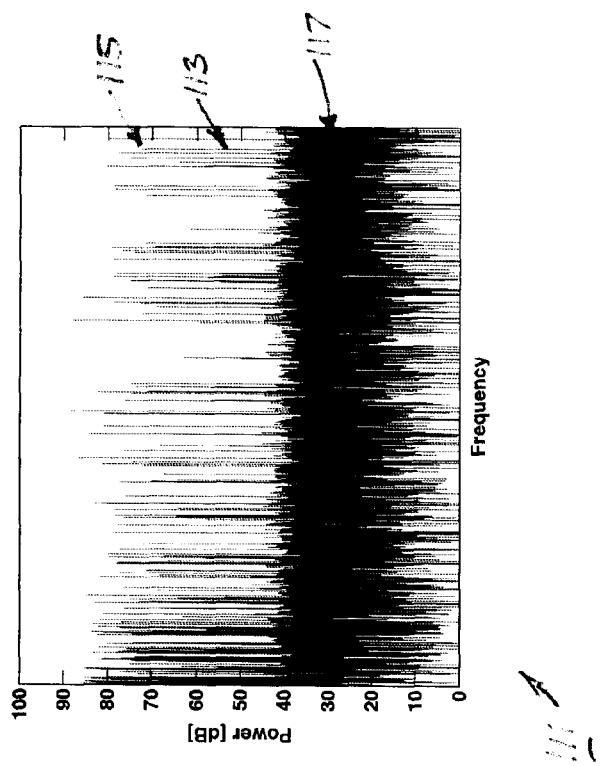
FIG. 7(b) is a graphical representation of a computer-simulated, analog output signal produced by a digital-to-analog signal conversion system similar in construction to the system shown in FIG. 2, the analog output signal being generated in response to the same digital input signal used to generate the analog output signal shown in FIG. 7(a).

By contrast, in FIG. 7(b), the same digital input signal used in FIG. 7(a) is converted into analog form using a system similar to system 11, the graphical representation depicting signal strength in view of signal frequency and being identified generally by reference numeral 131. In the present simulation, the system architecture relies upon Haar wavelet decomposition with three DACs of varying speeds, the fastest DAC having an ENOB value of 6 and a base sample rate, whereas the second and third DACs, each having an ENOB value of 8 (i.e. a component with a higher dynamic range), use one-half and a one-quarter, respectively, of the base sample rate.

As can be seen, the desired component 135 of output signal 133 in graph 131 is identical in strength to the desired component 115 of output signal 113 in graph 111. However, the noise component 137 present in graph 131 is considerably lower at lower frequencies (in the range between 0-20 dB) and even notably lower at higher frequencies as well (in the range of approximately 30 dB). Consequently, the overall dynamic range achieved by simulated system 11 is over 70 dB for lower frequency signals and 50 dB for signals in the higher frequency range.

The embodiment shown above is intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. A system for converting a digital input signal into a corresponding analog output signal, the system comprising:
    (a) a digital processing unit for decomposing the digital input signal into a plurality of digital input signal sub-components; and
    (b) a multirate digital-to-analog converter (DAC) bank, the DAC bank comprising an array of digital-to-analog converters (DACs) with varying sample rates for converting the plurality of digital input signal sub-components into a corresponding set of analog signal sub-components, the DAC bank combining together the set of analog signal sub-components to yield the analog output signal.

2. The system as claimed in claim 1 wherein the digital processing unit decomposes the digital input signal into a plurality of multirate signal sub-components.

3. The system as claimed in claim 2 wherein the digital processing unit decomposes the digital input signal into a plurality of multirate signal sub-components through discrete wavelet decomposition.

4. The system as claimed in claim 3 wherein the digital processing unit decomposes the digital input signal into a plurality of multirate signal sub-components through an overcomplete decomposition.

5. The system as claimed in claim 4 wherein the digital processing unit decomposes the digital input signal into a plurality of multirate signal sub-components through Haar wavelet decomposition.

6. The system as claimed in claim 2 wherein the digital processing unit decomposes the digital input signal into a plurality of multirate signal sub-components with varying quantization levels.

7. The system as claimed in claim 6 wherein the digital processing unit decomposes the digital input signal into a plurality of multirate signal sub-components, each of the plurality of multirate signal sub-components being designated for analog conversion by a corresponding DAC in the DAC bank.

8. The system as claimed in claim 7 wherein the digital processing unit decomposes the digital input signal into a plurality of multirate signal sub-components, each multirate signal sub-component having a quantization level that is defined by the digital processing unit based on the sample rate of the DAC for which the multirate signal sub-component is designated.

9. The system as claimed in claim 2 wherein the digital processing unit comprises a multirate filterbank for decomposing the digital input signal into the plurality of multirate signal sub-components.

10. The system as claimed in claim 9 wherein the multirate filterbank utilizes a dyadic discrete filterbank construction.

11. The system as claimed in claim 10 wherein the multirate filterbank includes an array of filter pairs.

12. The system as claimed in claim 9 wherein the digital processing unit further comprises an error and mismatch correction module for correcting imperfections in the analog output signal.

13. The system as claimed in claim 1 wherein the set of analog signal sub-components is combined together and time aligned through a summation module to yield the analog output signal.

14. The system as claimed in claim 1 wherein the sample rates for the plurality of DACs vary by a common factor.

15. The system as claimed in claim 14 wherein the sample rates for the plurality of DACs varies by a constant integer.

16. The system as claimed in claim 15 wherein the sample rates for the plurality of DACs varies by a factor of 2.

17. The system as claimed in claim 14 wherein the sample rates for the plurality of DACs are supplied from a common clock source.

* * * * *